US011894353B2

(12) United States Patent
Liang et al.

(10) Patent No.: US 11,894,353 B2
(45) Date of Patent: Feb. 6, 2024

(54) DRIVING SUBSTRATE AND MANUFACTURING METHOD THEREOF, AND MICRO LED BONDING METHOD

(71) Applicant: BOE TECHNOLOGY GROUP CO., LTD., Beijing (CN)

(72) Inventors: Zhiwei Liang, Beijing (CN); Wenqian Luo, Beijing (CN); Guoqiang Wang, Beijing (CN); Yingwei Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 155 days.

(21) Appl. No.: 17/010,575

(22) Filed: Sep. 2, 2020

(65) Prior Publication Data
US 2021/0091057 A1 Mar. 25, 2021

(30) Foreign Application Priority Data
Sep. 25, 2019 (CN) .......................... 201910911119.7

(51) Int. Cl.
H01L 23/00 (2006.01)
H01L 25/16 (2023.01)
H01L 27/12 (2006.01)

(52) U.S. Cl.
CPC ............ H01L 25/167 (2013.01); H01L 24/03 (2013.01); H01L 24/11 (2013.01); H01L 24/13 (2013.01);
(Continued)

(58) Field of Classification Search
CPC ......... H01L 24/13; H01L 24/81; H01L 24/16; H01L 2224/10126
See application file for complete search history.

(56) References Cited

U.S. PATENT DOCUMENTS

2012/0326951 A1* 12/2012 Yamazaki ............. G02F 1/1345
345/76
2015/0214128 A1* 7/2015 Lin ....................... H01L 21/563
257/712
(Continued)

FOREIGN PATENT DOCUMENTS

CN 102184680 A 9/2011
CN 104091788 A 10/2014
(Continued)

OTHER PUBLICATIONS

Definition of "Surround", https://www.thefreedictionary.com (2022) (Year: 2022).*
(Continued)

Primary Examiner — Michele Fan
(74) Attorney, Agent, or Firm — Brooks Kushman P.C.

(57) ABSTRACT

The present disclosure provides a driving substrate and a manufacturing method thereof, and a micro LED bonding method. The driving substrate includes: a base substrate; a driving function layer provided on the base substrate, and including a plurality of driving thin film transistors and a plurality of common electrode lines; a pad layer including a plurality of pads provided on a side of the driving function layer away from the base substrate, each pad including a pad body and a microstructure of hard conductive material provided on a side of the pad body away from the base substrate; and a plurality of buffer structures provided on the side of the driving function layer away from the base substrate, each buffer structure surrounding a portion of a corresponding microstructure close to the base substrate, and a height of the buffer structure being lower than a height of the microstructure.

11 Claims, 5 Drawing Sheets

(52) U.S. Cl.
CPC ............ *H01L 24/81* (2013.01); *H01L 27/124* (2013.01); *H01L 27/1259* (2013.01); *H01L 2224/0382* (2013.01); *H01L 2224/10122* (2013.01); *H01L 2224/1182* (2013.01); *H01L 2224/13007* (2013.01); *H01L 2224/13016* (2013.01); *H01L 2224/13078* (2013.01); *H01L 2224/81201* (2013.01)

(56) References Cited

U.S. PATENT DOCUMENTS

| | | | |
|---|---|---|---|
| 2018/0182740 A1* | 6/2018 | Kim | ........................ H01L 33/36 |
| 2019/0099997 A1 | 4/2019 | Hirai | |

FOREIGN PATENT DOCUMENTS

| | | | |
|---|---|---|---|
| CN | 208722864 U | 4/2019 | |
| CN | 109950270 A | 6/2019 | |

OTHER PUBLICATIONS

1$^{st}$ Chinese Office Action, English Translation.
CN102184680A, English Abstract and Machine Translation.
CN104091788A, English Abstract and Machine Translation.
CN109950270A, English Abstract and Machine Translation.
CN208722864U, English Abstract and Machine Translation.
First Office Action for Chinese Application No. 201910911119.7, dated May 20, 2021, 9 Pages.

* cited by examiner

DRIVING SUBSTRATE AND MANUFACTURING METHOD THEREOF, AND MICRO LED BONDING METHOD

CROSS-REFERENCE TO RELATED APPLICATION

This application claims priority to Chinese Patent Application No. 201910911119.7 filed on Sep. 25, 2019, which is incorporated herein by reference in its entirety.

TECHNICAL FIELD

The present disclosure relates to the field of display technology, and in particular to a driving substrate and a manufacturing method thereof, and a micro LED bonding method.

BACKGROUND

Micro LED (Micro Light Emitting Diode) display technology is a technology in which the size of a LED (light emitting diode) in the related art is reduced to below 100 μm, that is about 1% of the LED size in the related art, and then such LEDs are transferred by mass transfer technology to driving substrates to form a variety of different sizes of micro LED displays. The micro LED has many advantages such as high self-luminous brightness, high contrast, super-high resolution and color saturation, long life, fast response, energy saving, and wide adaptation to the environment, and has good application prospects in various fields. In order to reduce product cost and ensure product quality, the bonding process that connects the micro LED and the driving substrate must meet the requirements of large area and high yield.

SUMMARY

The present disclosure provides a driving substrate which includes:
a base substrate;
a driving function layer provided on the base substrate, the driving function layer including a plurality of driving thin film transistors and a plurality of common electrode lines;
a pad layer including a plurality of pads provided on a side of the driving function layer away from the base substrate, each pad including a pad body and a microstructure of hard conductive material provided on a side of the pad body away from the base substrate; and
a plurality of buffer structures provided on the side of the driving function layer away from the base substrate, each buffer structure surrounding a portion of a corresponding microstructure close to the base substrate, and a height of the buffer structure being lower than a height of the microstructure.

Optionally, each driving thin film transistor in the driving function layer includes a gate, a first electrode and a second electrode, the pad layer includes a plurality of first pads and a plurality of second pads, each of the first pads is connected to the first electrode of a corresponding thin film transistor, and each second pad is connected to a corresponding common electrode line.

Optionally, a material of the buffer structure is a photosensitive resin material.

Optionally, the buffer structure is in a shape of a truncated pyramid or a truncated cone.

Optionally, a material of the microstructure is the same as that of the pad body.

Optionally, the microstructure is in a shape of a cone tip or a microtube.

Optionally, the driving substrate specifically includes:
the base substrate;
a buffer layer located on the base substrate;
an active layer located on a side of the buffer layer away from the base substrate;
a gate insulation layer located on a side of the active layer away from the base substrate;
a gate of the driving thin film transistor located on a side of the gate insulation layer away from the base substrate;
an interlayer insulation layer located on a side of the gate away from the base substrate;
a source-drain metal layer located on a side of the interlayer insulation layer away from the base substrate, the source-drain metal layer including: a first electrode, a second electrode of the driving thin film transistor and a common electrode line, the first electrode and the second electrode being connected to the active layer through a via hole going through the interlayer insulation layer and the gate insulation layer;
a planarization layer located on a side of the source-drain metal layer away from the base substrate;
a passivation layer located on a side of the planarization layer away from the base substrate;
a pad layer located on a side of the passivation layer away from the base substrate, including a plurality of first pads and a plurality of second pads, each of the first pads being connected to the first electrode of a corresponding driving thin film transistor through a via hole going through the planarization layer and the passivation layer, each of the second pads being connected to a corresponding common electrode line through a via hole going through the planarization layer and the passivation layer, the first pad and the second pad each including a pad body and a microstructure of hard conductive material provided on a side of the pad body away from the base substrate;
a plurality of buffer structures provided on the side of the passivation layer away from the base substrate, each buffer structure surrounding a portion of a corresponding microstructure close to the base substrate, and a height of the buffer structure being lower than a height of the microstructure.

In addition, an embodiment of the present disclosure further provides a manufacturing method of a driving substrate which includes:
providing a base substrate;
forming a driving function layer on the base substrate, the driving function layer including a plurality of driving thin film transistors and a plurality of common electrode lines;
forming a pad layer on a side of the driving function layer away from the base substrate, the pad layer including a plurality of first pads and a plurality of second pads, each of the first pads being connected to a first electrode of a corresponding driving thin film transistor, each of the second pads being connected to a corresponding common electrode line, the first pad and the second pad each including a pad body and a microstructure of hard conductive material provided on a side of the pad body away from the base substrate; and
forming a plurality of buffer structures on the side of the driving function layer away from the base substrate, each buffer structure surrounding a portion of a corresponding microstructure close to the base substrate, and a height of the buffer structure being lower than a height of the microstructure.

Optionally, the forming a pad layer on a side of the driving function layer away from the base substrate includes:

forming a plurality of pad bodies, the pad bodies of the first pads being connected to the first electrodes of the driving thin film transistors, and the pad bodies of the second pads being connected to the common electrode lines;

forming microstructures on the pad bodies;

or, forming a plurality of pad bodies and a plurality of microstructures by a single patterning process, the pad bodies of the first pads being connected to the first electrodes of the driving thin film transistors, and the pad bodies of the second pads being connected to the common electrode lines.

Optionally, forming the plurality of buffer structures surrounding the microstructures includes:

coating a photosensitive material on the pad layer to form a photosensitive material layer;

performing grayscale exposure on the photosensitive material layer using a mask and performing development to form the plurality of buffer structures surrounding the microstructures.

In addition, an embodiment of the present disclosure further provides a micro LED bonding method which includes:

providing a driving substrate which is the above driving substrate;

aligning a transfer carrier loaded with micro LEDs with the driving substrate, and pressing the transfer carrier and/or the driving substrate so that the microstructures of the driving substrate penetrate into third and fourth pads of the micro LEDs, the first pads of the driving substrate being in contact with the third pads of the micro LEDs, and the second pads of the driving substrate being in contact with the fourth pads of the micro LEDs.

DETAILED DESCRIPTION

In order to make the objects, technical solutions and advantages of the embodiments of the present disclosure clearer, the technical solutions of the embodiments of the present disclosure will be described clearly and thoroughly in conjunction with the accompanying drawings of the embodiments of the present disclosure. Obviously, the described embodiments are some of the embodiments of the present disclosure, rather than all of the embodiments. Based on the described embodiments of the present disclosure, all other embodiments obtained by a person of ordinary skill in the art fall within the protective scope of the present disclosure.

The present disclosure provides a driving substrate and a manufacturing method thereof, and a micro LED bonding method to solve the problem in the related art that it is difficult to ensure the uniformity and yield of microstructures penetrated into the micro LED electrodes when the micro LEDs are bonded in a large area.

When micro LEDs are bound using microstructures, the micro LEDs are adhered to a temporary transfer carrier, and a certain force is applied to the temporary transfer carrier to make the microstructures penetrate into the electrodes of the micro LEDs, wherein the thickness of the electrode may generally be 2-3 µm, and the height of the microstructure may be 2-3 µm. In order to achieve large-area micro LED bonding, a large-area temporary transfer carrier is required. However, due to the difference in uniformity of pressure on the large-area temporary carrier and uniformity of height of the cone tip, it is difficult to ensure a consistent pressed depth of the cone tip.

Figure 1:
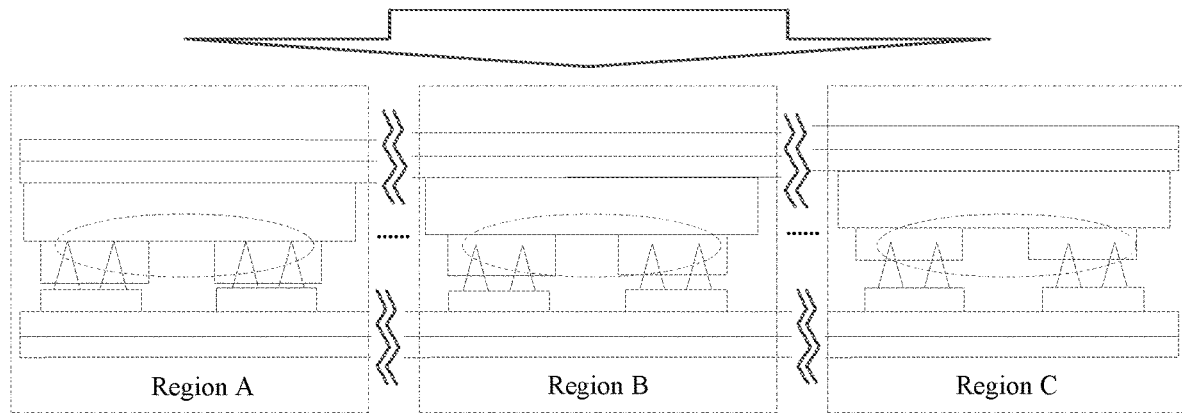
FIG. 1 is a first structural diagram of micro LED bonding performed by using a driving substrate in the related art.
Figure 2:
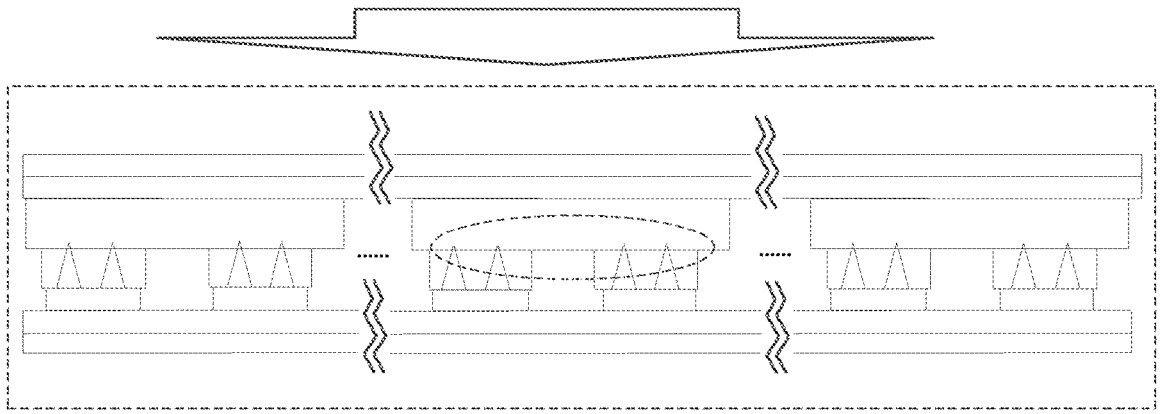
FIG. 2 is a second structural diagram of micro LED bonding performed by using a driving substrate in the related art.

As shown in FIG. 1, the penetration depth of the microstructure in different regions is different. The penetration depth of region A is too large, the penetration depth of region B is moderate, and the penetration depth of region C is too small. The larger the penetration depth of the microstructure is, the smaller the connection resistance between the micro LED and the driving substrate is, resulting in a larger difference in contact resistance, which ultimately presents an uneven display of the micro LEDs. In addition, as shown in FIG. 2, in order to improve the uniformity of bonding and avoid the depth of the microstructure being pressed into the electrode too small, the force applied on the temporary transfer carrier can be increased. However, when the applied force is too large, it is apt to penetrate into the electrode of the micro LED too deeply, damage the chip of the micro LED, and cause bonding failure. Therefore, it is difficult to balance the uniformity and yield of the microstructure penetrating into the micro LED electrode during the micro LED bonding process.

Figure 3:
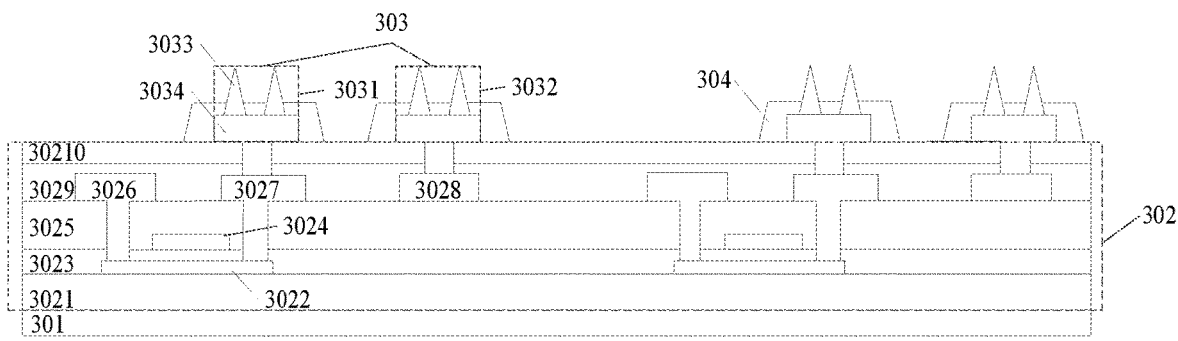
FIG. 3 is a structural diagram of a driving substrate in an embodiment of the present disclosure.

Referring to FIG. 3, it is a structural diagram of a driving substrate in an embodiment of the present disclosure. In order to solve the above problem, an embodiment of the present disclosure provides a driving substrate including:

a base substrate 301, which may be a glass substrate, or may be a substrate made of other materials;

a driving function layer 302 provided on the base substrate 301, the driving function layer including a plurality of driving thin film transistors and a plurality of common electrode lines;

a pad layer 303 provided on a side of the driving function layer 302 away from the base substrate 301, and including a plurality of first pads 3031 and a plurality of pads 3032, each of the first pads 3031 being connected to the first electrode of a corresponding thin film transistor, each of the second pads being connected to a corresponding common electrode line, each of the first pads 3031 and the second pads 3032 including a pad body (SD2) 3034 and a microstructure (microstructures) 3033 of hard conductive material provided on a side of the pad body 3034 away from the base substrate;

wherein the first pads 3031 and the second pads 3032 form an nx m array as needed;

a plurality of buffer structures 304 provided on the side of the driving function layer away from the base substrate, each buffer structure 304 surrounding a portion of a corresponding microstructure 3033 close to the base substrate, and a height of the buffer structure 304 being lower than a height of the microstructure 3033;

wherein, the heights of the plurality of first pads 3031 and the plurality of second pads 3032 are the same, and the heights of the plurality of buffer structures 304 are the same.

Figure 4:
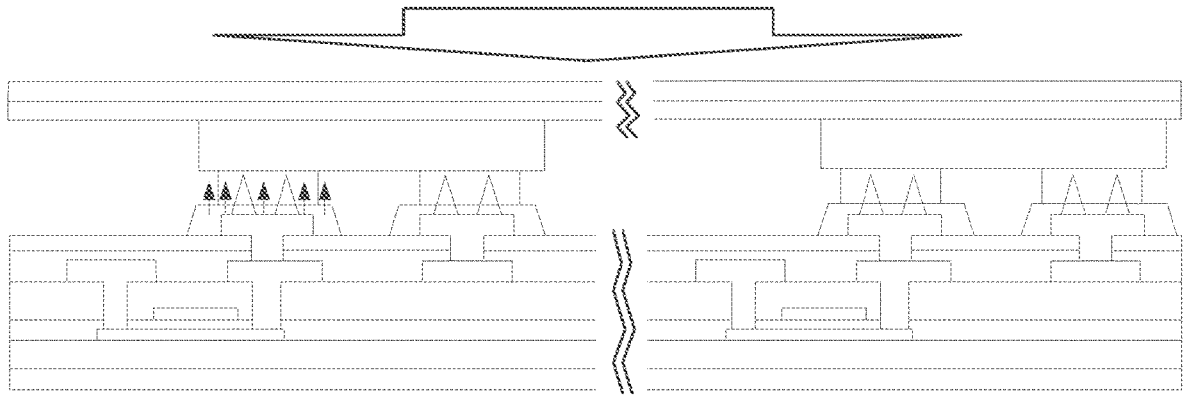
FIG. 4 is a structural diagram of micro LED bonding performed by using a driving substrate in an embodiment of the present disclosure.

In the above embodiment of the present disclosure, the buffer structures are provided around the microstructures, thereby providing a driving substrate with buffer structures. As shown in FIG. 4, due to the existence of the buffer structures, during the large-area bonding process, the applied pressure can be increased to ensure the uniform depth of the micro LED electrodes inserted into the microstructures, while avoiding the damage of the micro LEDs due to excessive pressure, and improving the uniformity and yield of the microstructures penetrated into the micro LED electrodes during the micro LED bonding process.

In some embodiments of the present disclosure, the material of the buffer structure 304 is a photosensitive resin material.

In the above embodiment of the present disclosure, during the manufacturing process, the buffer structures can be made by utilizing the photosensitivity of the material of the buffer structures by photolithography. The resin material is easy to be molded and has certain elasticity, which can better serve as a buffer and avoid damage to the micro LEDs and the pad layer.

In some embodiments of the present disclosure, the buffer structure 304 is in a shape of a truncated pyramid or a truncated cone.

In the above embodiment of the present disclosure, the upper and lower platforms of a truncated pyramid or truncated cone shape are parallel to the driving function layer, so that the uniformity of the micro LED bonding process can be ensured. In addition, the truncated pyramid or truncated cone shape is a very stable structure, which has a small manufacturing difficulty, and the use of such shape reduces the manufacturing difficulty of the buffer structures.

In some embodiments of the present disclosure, the material of the microstructure 3033 is the same as that of the pad body 3034;

the material for the microstructure 3033 and the pad body 3034 may be a source-drain metal material.

In the above embodiment of the present disclosure, the microstructures and the pad bodes are made of the same material, which not only reduces the process flow of changing the material, but also provides more ways to make the pad layer. The microstructures and the pad bodies can be made not only separately, but also as a whole.

In some embodiments of the present disclosure, the microstructure 3033 is in a shape of a cone tip or a microtube.

In the above embodiment of the present disclosure, the microstructure of a cone tip or a microtube shape is simple in shape and convenient to manufacture. At the same time, it can be stably inserted into the electrode of the micro LED to ensure the stability of bonding.

The beneficial effects of the technical solution of the present disclosure are as follows: a driving substrate provided with buffer structures is provided. The buffer structures are arranged around the microstructures. During the large-area bonding process of micro LEDs, due to the buffering effect of the buffer structures when the microstructures are in contact with the micro LED electrodes, the pressure can be appropriately increased to ensure that the microstructures are inserted into the micro LED electrodes at the same depth, while avoiding excessive pressure to further insert the microstructures into the micro LEDs, thereby avoiding the damage of the micro LEDs and increasing the uniformity and yield of large-area bonding of micro LEDs.

In some embodiments of the present disclosure, as shown in FIG. 3, the driving substrate specifically includes:

the base substrate 301;

a buffer layer (Buffer) 3021 located on the base substrate;

an active layer (Active) 3022 located on a side of the buffer layer away from the base substrate 301, the active layer may be made of LTPS (low temperature polysilicon);

a gate insulation layer (GI) 3023 located on a side of the active layer 3022 away from the base substrate 301;

a gate (Gate) 3024 of the driving thin film transistor located on a side of the gate insulation layer 3023 away from the base substrate 301;

an interlayer insulation layer (ILD) 3025 located on a side of the gate 3024 away from the base substrate 301;

a source-drain metal layer located on a side of the interlayer insulation layer 3025 away from the base substrate 301, the source-drain metal layer including: a first electrode (Drain) 3026, a second electrode (Source) 3027 of the driving thin film transistor and a common electrode line (SD1) 3028, the first electrode 3026 and the second electrode 3027 being connected to the active layer 3022 through a via hole going through the interlayer insulation layer 3025 and the gate insulation layer 3023;

a planarization layer (PLN) 3029 located on a side of the source-drain metal layer away from the base substrate 301;

a passivation layer (PVX) 30210 located on a side of the planarization layer 3029 away from the base substrate 301;

a pad layer 303 located on a side of the passivation layer 30210 away from the base substrate 301, including a plurality of first pads 3031 and a plurality of second pads 3032, each of the first pads 3031 being connected to the first electrode 3026 of a corresponding driving thin film transistor through a via hole going through the planarization layer 3029 and the passivation layer 30210, the second pad 3032 being connected to a corresponding common electrode line 3028 through a via hole going through the planarization layer 3029 and the passivation layer 30210, the first pad 3031 and the second pad 3032 each including a pad body 3034 and a microstructure 3033 of hard conductive material provided on a side of the pad body 3034 away from the base substrate 301;

a plurality of buffer structures 304 provided on the side of the passivation layer 30210 away from the base substrate 301, each buffer structure 304 surrounding a portion of a corresponding microstructure 3033 close to the base substrate 301, and a height of the buffer structure 304 being lower than a height of the microstructure 3033.

In the above embodiment of the present disclosure, a driving substrate is provided, which can drive the micro LEDs to display after being bonded with the micro LEDs. In addition, due to the buffer structures, the driving substrate provided in the above embodiment not only facilitates increasing the pressure applied on the temporary transfer carrier to improve the uniformity of the connection resistances between the microstructures and the electrodes, but also prevent the microstructures from being inserted into the micro LEDs and causing damage to the micro LED chips.

Figure 5:
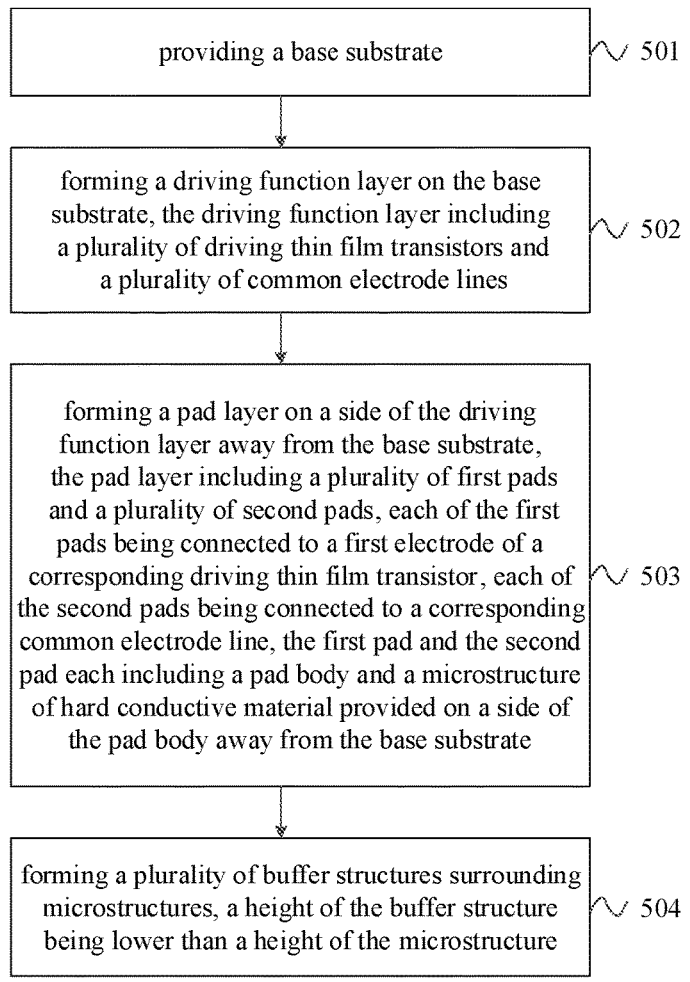
FIG. 5 is a schematic flowchart of a manufacturing method of a driving substrate in an embodiment of the present disclosure.

In addition, an embodiment of the present disclosure further provides a manufacturing method of a driving substrate, as shown in FIG. 5, including:

Step 501: providing a base substrate;

Step 502: forming a driving function layer on the base substrate, the driving function layer including a plurality of driving thin film transistors and a plurality of common electrode lines;

Step 503: forming a pad layer on a side of the driving function layer away from the base substrate, the pad layer including a plurality of first pads and a plurality of second pads, each of the first pads being connected to a first electrode of a corresponding driving thin film transistor, each of the second pads being connected to a corresponding common electrode line, the first pad and the second pad each including a pad body and a microstructure of hard conductive material provided on a side of the pad body away from the base substrate;

Step 504: forming a plurality of buffer structures on the side of the driving function layer away from the base substrate, each buffer structure surrounding a portion of a corresponding microstructure close to the base substrate, and a height of the buffer structure being lower than a height of the microstructure.

In the above embodiment of the present disclosure, a driving substrate with buffer structures are manufactured. By forming a pad layer on the driving function layer to achieve the large-area connection between the driving function layer and the micro LED electrodes, and forming the buffer structures surrounding the microstructures, the uniformity of the connection resistances between the microstructures and the electrodes can be improved, and the microstructures can be prevent from damaging the micro LED chips due to excessive pressure applied, while ensuring the uniformity and yield of the microstructures penetrating into the micro LED electrodes during the micro LED bonding process.

Figure 6:
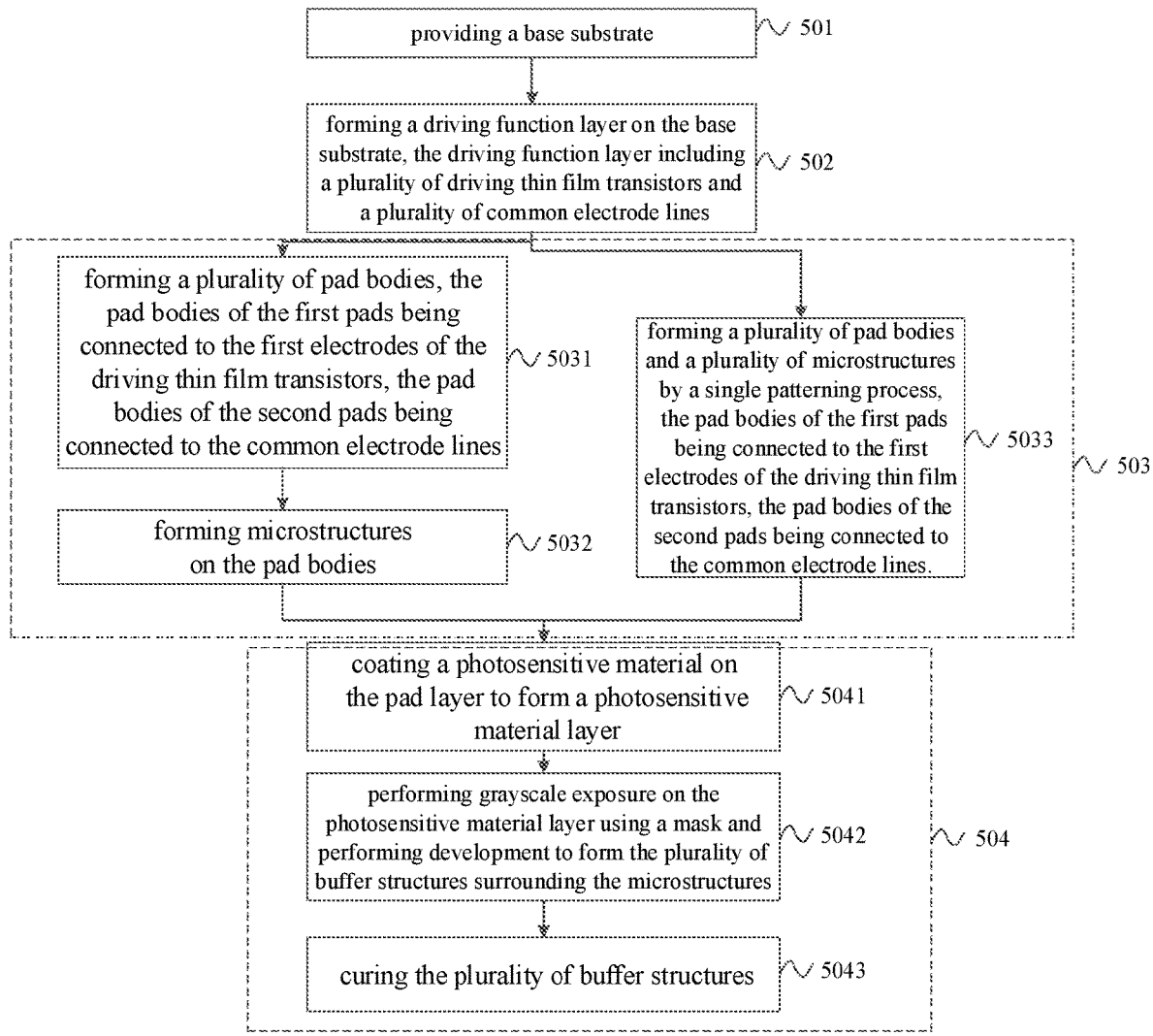
FIG. 6 is a schematic flowchart of a manufacturing method of a driving substrate in another embodiment of the present disclosure.

In some embodiments of the present disclosure, as shown in FIG. 6, Step 503 includes:

Step S031: forming a plurality of pad bodies, the pad bodies of the first pads being connected to the first electrodes of the driving thin film transistors, and the pad bodies of the second pads being connected to the common electrode lines;

Step S032: forming microstructures on the pad bodies; or,

Step S033: forming a plurality of pad bodies and a plurality of microstructures by a single patterning process, the pad bodies of the first pads being connected to the first electrodes of the driving thin film transistors, and the pad bodies of the second pads being connected to the common electrode lines.

In the above embodiments of the present disclosure, the pad layer is manufactured by two methods, so that the pad bodies and the microstructures may be manufactured separately, or may be manufactured by a single patterning process, and thus the manufactured methods are diverse and flexible.

Figure 7:
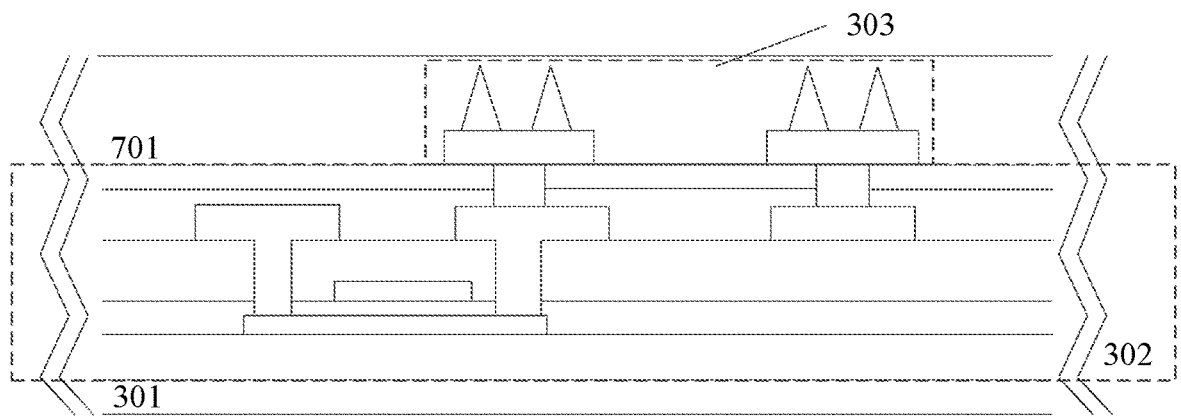
FIG. 7 is a schematic diagram of a coating process of a manufacturing method of a driving substrate in an embodiment of the present disclosure.
Figure 8:
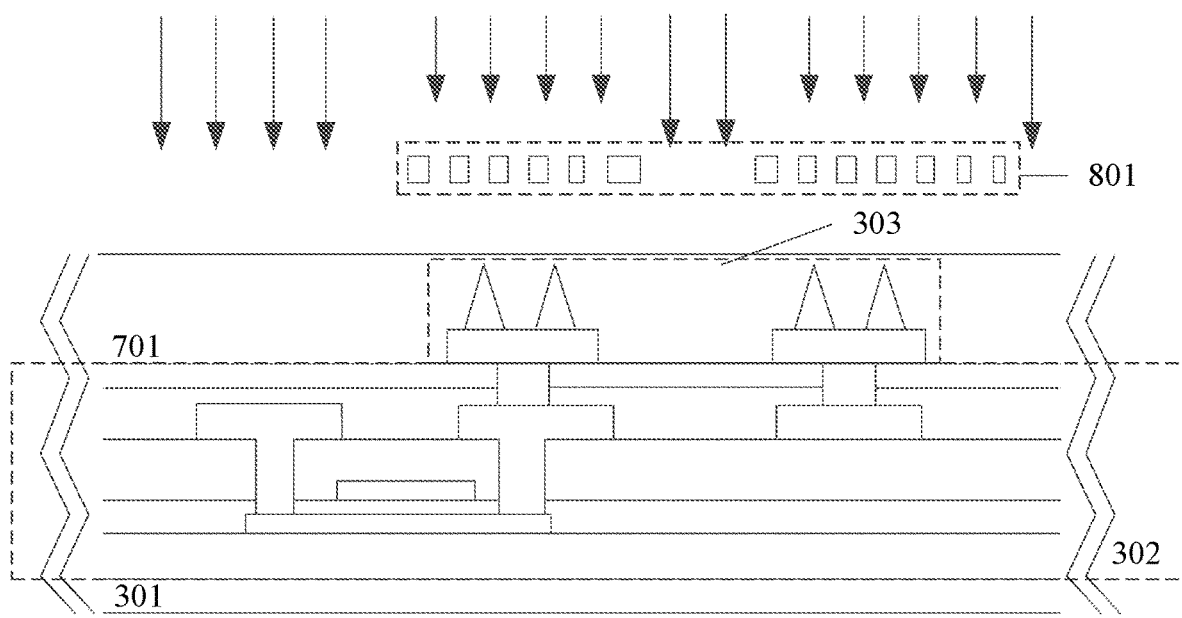
FIG. 8 is a schematic diagram of an exposure process of a manufacturing method of a driving substrate in an embodiment of the present disclosure.

In some embodiments of the present disclosure, as shown in FIG. 6, Step 504 includes:

Step S041: as shown in FIG. 7, which is a schematic diagram of a coating process of the manufacturing method of a driving substrate in an embodiment of the present disclosure, coating a photosensitive material on the pad layer to form a photosensitive material layer (Resin) 701;

Step S042: performing grayscale exposure on the photosensitive material layer using a mask and performing development to form a plurality of buffer structures surrounding the microstructures;

wherein, as shown in FIG. 8, the mask is a grayscale mask 801. The grayscale mask adjusts the metal strip density of the portion to be exposed by adding metal strips to the portion to be exposed, thereby controlling the exposure intensity. Thereby, portions of the photosensitive material layer 701 after exposure have different thicknesses, ensuring that the upper surfaces of the buffer structures are parallel to the upper surface of the driving function layer;

wherein, if the photosensitive material is a photosensitive resin material, after Step S042, Step 504 may further include Step S043: curing the plurality of buffer structures.

In the above embodiments of the present disclosure, the buffer structures with a certain height are manufactured by using grayscale exposure, which can directly manufacture a plurality of buffer structures on the basis of the completed driving function layer and pad layer, ensuring the consistency of the heights of the buffer structures and the matching degree with the microstructures.

Figure 9:
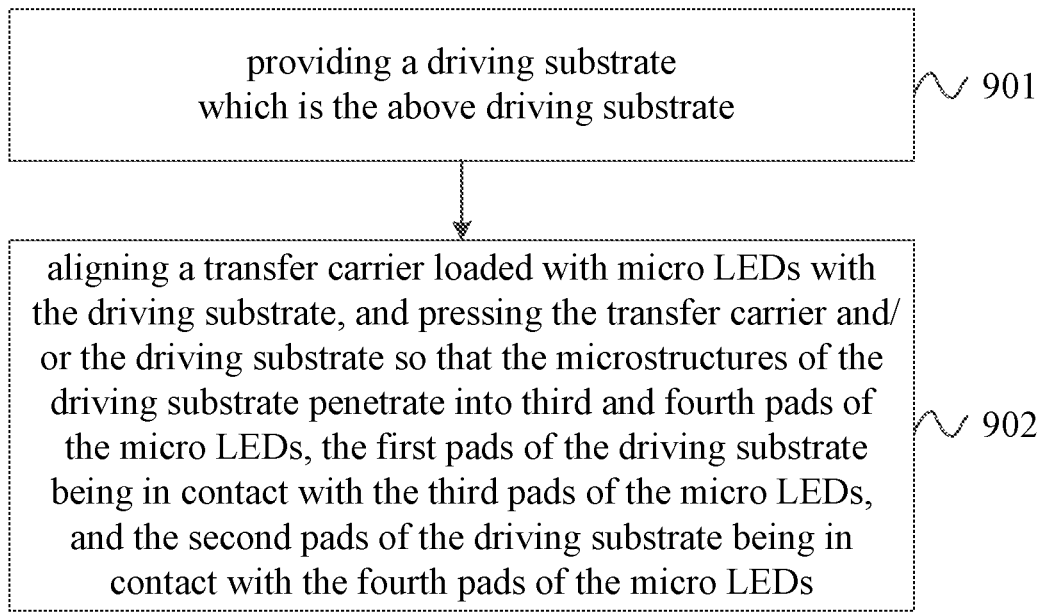
FIG. 9 is a schematic flowchart of a micro LED bonding method in an embodiment of the present disclosure.

In addition, an embodiment of the present disclosure further provides a micro LED bonding method, as shown in FIG. 9, including:

Step 901: providing a driving substrate which is the above driving substrate;

Step 902: aligning a transfer carrier loaded with micro LEDs with the driving substrate, and pressing the transfer carrier and/or the driving substrate so that the microstructures of the driving substrate penetrate into third and fourth pads of the micro LEDs, the first pads of the driving substrate being in contact with the third pads of the micro LEDs, and the second pads of the driving substrate being in contact with the fourth pads of the micro LEDs.

In the above embodiment of the present disclosure, by using the driving substrate with a buffer structure to bond the micro LEDs, the applied pressure can be increased to ensure the uniform depth of the micro LED electrodes inserted into the microstructures, while avoiding the damage of the micro LEDs due to excessive pressure, and improving the uniformity and yield of the micro LED bonding process.

The above are optional implementations of the present disclosure. It should be noted that, for those of ordinary skill in the art, without departing from the principle described in the present disclosure, several improvements and modifications can be made, which should also be regarded as the protection scope of the present disclosure.

What is claimed is:

1. A driving substrate, comprising:
a base substrate;
a driving function layer provided on the base substrate, the driving function layer comprising a plurality of driving thin film transistors and a plurality of common electrode lines;
a pad layer comprising a plurality of pads provided on a side of the driving function layer away from the base substrate, each pad comprising a pad body and a microstructure of hard conductive material provided on a side of the pad body away from the base substrate, wherein the microstructure is provided to be inserted into a micro LED and in contact with the micro LED; and
a plurality of buffer structures provided on the side of the driving function layer away from the base substrate, wherein each of the plurality of buffer structures surrounds a portion of a corresponding microstructure close to the base substrate, an upper surface of the buffer structures is parallel with the upper surface of the driving function layer, and a height of the upper surface of the buffer structure exceeds a height of the pad body and is lower than a height of the microstructure;
wherein each buffer structure is formed in contact with a microstructure, every two adjacent pads are spaced by a first interval, and a second interval exists between the buffer structures corresponding to two adjacent pads, wherein the orthogonal projection of the first interval on the base substrate overlaps with the orthogonal projection of the second interval on the base substrate.

2. The driving substrate according to claim 1, wherein each driving thin film transistor in the driving function layer comprises a gate, a first electrode and a second electrode, the pad layer comprises a plurality of first pads and a plurality of second pads, each of the first pads is connected to the first electrode of a corresponding thin film transistor, and each second pad is connected to a corresponding common electrode line.

3. The driving substrate according to claim 1, wherein a material of the buffer structure is a photosensitive resin material.

4. The driving substrate according to claim 1, wherein the buffer structure is in a shape of a truncated pyramid or a truncated cone.

5. The driving substrate according to claim 1, wherein a material of the microstructure is the same as that of the pad body.

6. The driving substrate according to claim 1, wherein the microstructure has a shape of a cone tip or a microtube.

7. The driving substrate according to claim 1, comprising:
the base substrate;
a buffer layer located on the base substrate;
an active layer located on a side of the buffer layer away from the base substrate;
a gate insulation layer located on a side of the active layer away from the base substrate;
a gate of the driving thin film transistor located on a side of the gate insulation layer away from the base substrate;
an interlayer insulation layer located on a side of the gate away from the base substrate;
a source-drain metal layer located on a side of the interlayer insulation layer away from the base substrate, the source-drain metal layer comprising: a first electrode, a second electrode of the driving thin film transistor and a common electrode line, the first electrode and the second electrode being connected to the active layer through a via hole going through the interlayer insulation layer and the gate insulation layer;
a planarization layer located on a side of the source-drain metal layer away from the base substrate;
a passivation layer located on a side of the planarization layer away from the base substrate;
the pad layer is located on a side of the passivation layer away from the base substrate, comprising a plurality of first pads and a plurality of second pads, each of the first pads being connected to the first electrode of a corresponding driving thin film transistor through a via hole going through the planarization layer and the passivation layer, each of the second pads being connected to a corresponding common electrode line through a via hole going through the planarization layer and the passivation layer, the first pad and the second pad each comprising the pad body and the microstructure of hard conductive material provided on a side of the pad body away from the base substrate;
the plurality of buffer structures is provided on a side of the passivation layer away from the base substrate, each buffer structure surrounding a portion of a corresponding microstructure close to the base substrate, and a height of the buffer structure being lower than a height of the microstructure.

8. A manufacturing method of a driving substrate, comprising:
providing a base substrate;
forming a driving function layer on the base substrate, the driving function layer comprising a plurality of driving thin film transistors and a plurality of common electrode lines;
forming a pad layer on a side of the driving function layer away from the base substrate, the pad layer comprising a plurality of first pads and a plurality of second pads, each of the first pads being connected to a first electrode of a corresponding driving thin film transistor, each of the second pads being connected to a corresponding common electrode line, the first pad and the second pad each comprising a pad body and a microstructure of hard conductive material provided on a side of the pad body away from the base substrate, wherein the microstructure is provided to be inserted into a micro LED and in contact with the micro LED; and
forming a plurality of buffer structures on the side of the driving function layer away from the base substrate, wherein each of the buffer structures surrounds a portion of a corresponding microstructure close to the base substrate, an upper surface of the buffer structures is parallel with the upper surface of the driving function layer, and a height of the upper surface of the buffer structure exceeds a height of the pad body and is lower than a height of the microstructures;
wherein each buffer structure is formed in contact with a microstructure, every two adjacent pads are spaced by a first interval, and a second interval exists between the buffer structures corresponding to two adjacent pads, wherein the orthogonal projection of the first interval on the base substrate overlaps with the orthogonal projection of the second interval on the base substrate.

9. The manufacturing method according to claim 8, wherein the forming a pad layer on a side of the driving function layer away from the base substrate comprises:
forming a plurality of pad bodies, the pad bodies of the first pads being connected to the first electrodes of the driving thin film transistors, and the pad bodies of the second pads being connected to the common electrode lines;

forming microstructures on the pad bodies;

or, forming a plurality of pad bodies and a plurality of microstructures by a single patterning process, the pad bodies of the first pads being connected to the first electrodes of the driving thin film transistors, the pad bodies of the second pads being connected to the common electrode lines.

10. The manufacturing method according to claim 8, wherein forming the plurality of buffer structures surrounding the microstructures comprises:

coating a photosensitive material on the pad layer to form a photosensitive material layer;

performing grayscale exposure on the photosensitive material layer using a mask and performing development to form the plurality of buffer structures surrounding the microstructures.

11. A micro LED bonding method, comprising:

providing a driving substrate which is the one according to claim 1;

aligning a transfer carrier loaded with micro LEDs with the driving substrate, and pressing the transfer carrier and/or the driving substrate so that the microstructures of the driving substrate penetrate into third and fourth pads of the micro LEDs, the first pads of the driving substrate being in contact with the third pads of the micro LEDs, and the second pads of the driving substrate being in contact with the fourth pads of the micro LEDs.

* * * * *